United States Patent [19]

Sayed

[11] Patent Number: 4,672,310

[45] Date of Patent: Jun. 9, 1987

[54] SWITCH POSITION SENSING DEVICE FOR USE WITH VALVE OPERATORS

[75] Inventor: Edmond A. Sayed, Marietta, Ga.

[73] Assignee: Movats Incorporated, Marietta, Ga.

[21] Appl. No.: 794,301

[22] Filed: Nov. 1, 1985

[51] Int. Cl.[4] ........................ G01R 19/14; G08B 17/10

[52] U.S. Cl. .................................... 324/133; 324/422; 340/644; 137/554

[58] Field of Search ............... 324/133, 415, 418, 422; 340/524, 686, 687, 644; 137/551, 552, 554; 73/168

[56] References Cited

U.S. PATENT DOCUMENTS

| | | | |
|---|---|---|---|
| 4,542,649 | 9/1985 | Charbonneau et al. | 73/168 |
| 4,575,718 | 3/1986 | Ludowyk | 340/686 X |
| 4,578,669 | 3/1986 | Woods | 340/524 X |

*Primary Examiner*—Reinhard J. Eisenzopf
*Assistant Examiner*—Jack B. Harvey
*Attorney, Agent, or Firm*—Louis T. Isaf

[57] ABSTRACT

A switch position sensing device gives visual and recorded information as to the relative open and closed position of a monitored switch whether the monitored switch is found within an AC or DC circuit or a dead circuit and without disturbing the wiring of the switches primary circuit.

1 Claim, 6 Drawing Figures

SWITCH POSITION SENSING DEVICE FOR USE WITH VALVE OPERATORS

FIELD OF THE INVENTION

This invention relates generally to the field of testing and diagnosis of valve operators and more specifically to a new device and system form indicating the relative positions (open-closed) of torque and limit switches within the operator.

BACKGROUND OF THE INVENTION

Within the power industry, valves are operated remotely from open, closed and intermediate positions to improve or maintain utility power plant output, or in many cases to provide for the protection of plant equipment, as well as protection of the general public from release of radioactive materials either directly or indirectly. Continual, proper operation of the valves is essential to the well-being of the industry and the general public. The extreme emphasis on safety in Nuclear power plants (and the presently bad reputation of the nuclear industry) has put a premium on the importance of maintaining proper operation of valves, of which there may be hundreds within a single plant.

At the forefront of industry attempts to monitor and maintain proper operation of these critical valves is the recent invention of Arthur G. Charbonneau, et al described in U.S. Pat. No. 4,542,649. The Charbonneau, et al invention disclosed a new and important valve operator and monitoring system to measure, record and correlate valve stem load, limit and torque switch positions, spring pack movement and motor current providing time related information on valve performance. The information made available by Charbonneau, et al provides a direct indication of developing valve and operator problems such as excessive or inadequate packing load, excessive inertia, proximity to premature tripping, incorrectly set operating limit and torque switches, improperly functioning thermal overload devices, inadequate or excessive stem thrust loads, gear train wear, stem damage, and load relaxation.

The prior, Charbonneau et al invention teaches the use of a limit/torque switch position indicating device. This device provides data, for recording and correlation with the other collected data, which indicates when, in relative time, a particular limit switch or torque switch is open or closed. The particular sensing circuit of Charbonneau et al has been found to be impractical and unusable in certain industry applications. For example, the Charbonneau et al circuit requires access to a negative terminal for a ground. In most all nuclear power plants known to the industry, regulations prevent lifting wire leads, or cutting into or splicing into wiring systems of the valve operator to gain access to a negative terminal; and in many nuclear power plants there are no free negative terminals available in the operator's control circuitry. Furthermore, Charbonneau et al makes use of the current flowing through the operator limit and torque switches to induce a field in a coil. Such a method can not be employed in power plants where the operator switches are found in DC circuits, since DC will not induce a field in a coil. .

SUMMARY OF THE INVENTION

Briefly describe the present invention comprises an improved switch position sensing device which incorporates into its own circuit design the switch which is to be monitored; such that the monitored switch serves as a component of both the invention circuit and the primary-function circuit. The present invention makes use of the power source from the primary-function circuitry to provide power to the invented device when the monitored switch is open; and the invention further comprises a second power supply which provides power to the new device when the monitored switch is closed. Transistors, or transistor type switching elements, are used together with uniquely positioned diodes and resistors to selectively direct current to visual indicators. Visual indicators of the invention provide a visually perceptible feedback, observable by a user of the present device, which visually perceptible feedback corresponds to the open or closed position of the monitored switch.

In preferred embodiments, one of the visual indicators comprises a third circuit associated with the current directing circuit yet defining independent circuit flow. This visual indicator circuit of the preferred embodiment of the present invention comprises a third power supply and a voltage recording instrument such as an oscilloscope and circuit elements arranged to provide a predetermined voltage at the recording instrument whenever current flows through the visual indicator circuit.

In other embodiments of the present invention, an LED is used as a visual indicator, being lit when the switch is closed and being unlit when the switch is open. In still another embodiment, a single LED is used, one LED being lit when the switch is opened and unlit when the switch is closed.

In the most preferred embodiment, a combination of the three above mentioned indicators, or various combinations thereof are contemplated.

Thus, it is an object of the present invention to provide a switch position sensing device which accurately senses and indicates the open or closed position of a monitored switch without the need to access a negative terminal within the primary-function circuit and without the need of cutting into or splicing into the primary-function circuit.

Another object of the present invention is to provide a switch position sensing device which records at a recording instrument data as to the open or closed position of a monitored switch within a primary-function circuit, whether the primary-function circuit is an AC or DC circuit, or a dead switch terminal.

Yet another object of the present invention is to provide simultanous sensing and indicating of positions of multiple switches within the same primary-function circuit.

Other objects, features and advantages of the present invention will become apparent upon reading the following specifications, when taken in conjunction with the accompany drawings.

DETAILED DESCRIPTION OF THE PREFERRED EMBODIMENTS

Figure 1:
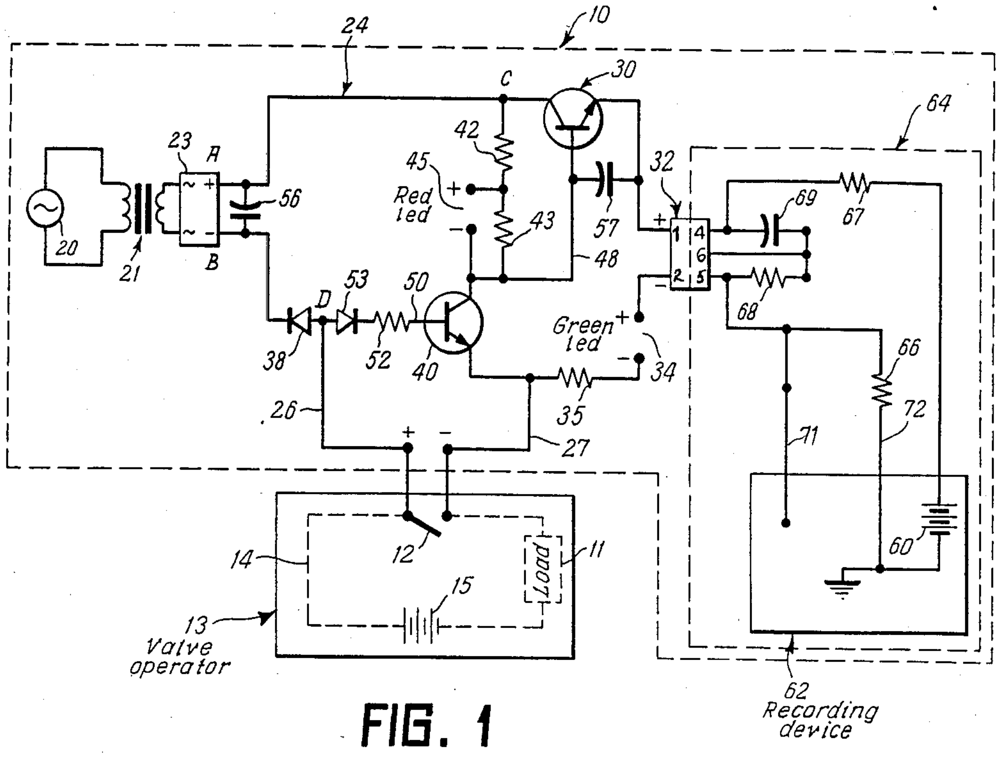
FIG. 1 is a schematic diagram of the switch position sensing circuit for a single switch, in accordance with the present invention.
Figure 2:
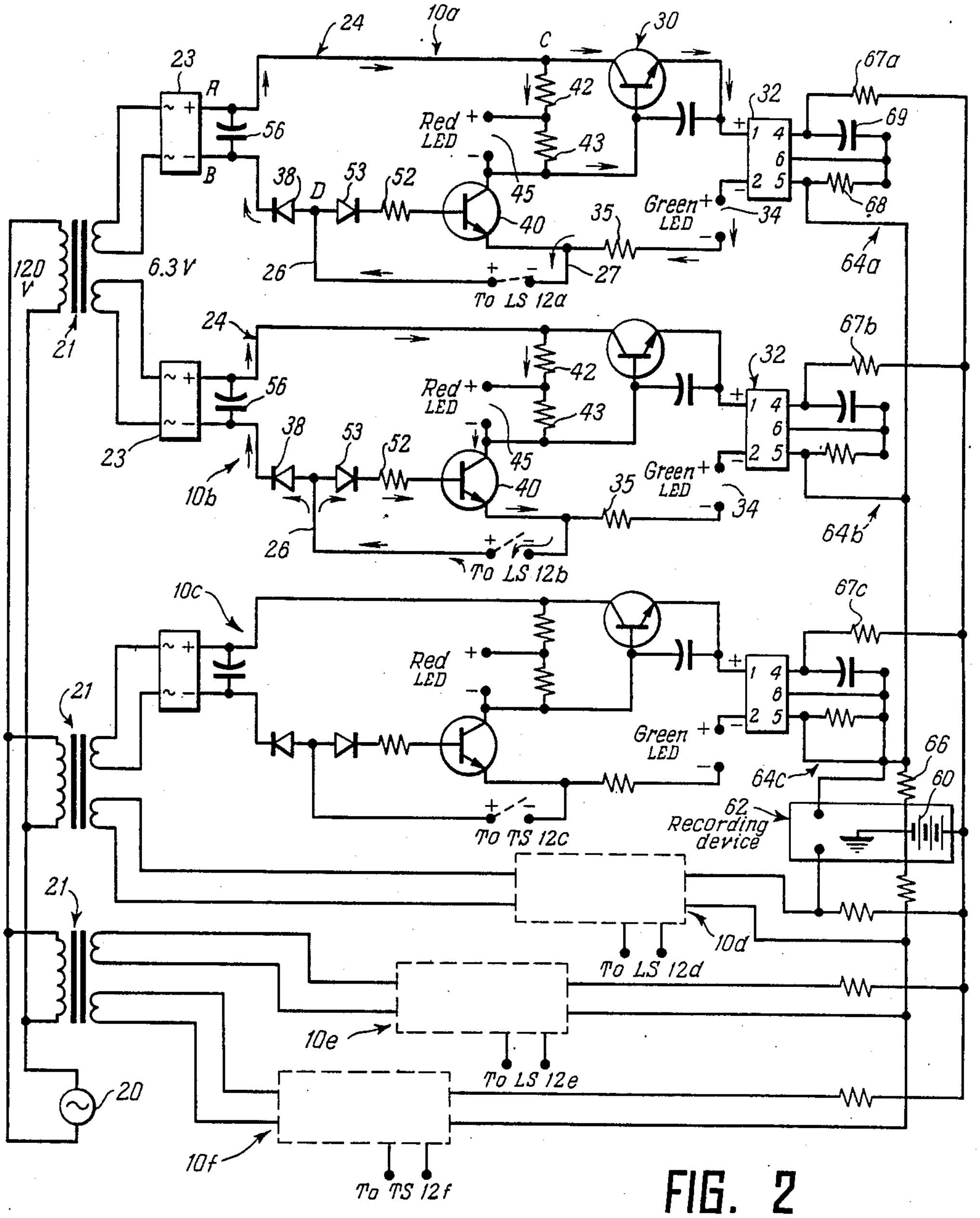
FIG. 2 is a schematic diagram of the switch position sensing circuit for monitoring multiple switches, in accordance with the present invention.

Referring now in greater detail to the drawings in which like Numerals represent like components throughout the several views, FIG. 1 shows, in schematic form, a switch position sensing device 10 of the present invention in its most preferred form, as used to monitor a single switch. The monitored switch 12 is an existing switch component of the circuitry of a prior apparatus 13, such as a valve operator. 13. FIG. 2 depicts open-to-closed and closed-to-open circuits of a typical valve operator. Since the primary function of the monitored switch 12 is to operate within the prior art apparatus 13, the circuitry of the prior art apparatus will also be referred to herein as the "primary-function circuit 14".

The primary-function circuit 14 is supplied power in the typical manner known in the art through a power source 15 which is shown in FIG. 1 as a battery source. Although shown here as a battery source, it is understood that the primary function power source 15 may be either an AC or DC source providing either AC or DC power to the primary-function circuit 14 through the monitored switch 12 to operate some primary load 11.

The switch position sensing device 10 of the present invention is shown as including a second power source 20 which provides AC power through a transformer 21 to a full wave bridge rectifier 23. In typical manner, a branch of unidirectional current is created in the rectifier 23 between points A and B and this branch shall, for purposes of this disclosure, be termed the unidirectional branch ("UD branch") 24.

Positioned within the UD branch 24 is a first lead wire 26 and a second lead wire 27. Each of the lead wires 26,27 is connected to one side of the monitored switch 12 such that the switch is a switch within the UD branch 24 as well as within the primary-function circuit 14. A transistor 30 is positioned within the UD branch 24 with its collector and emitter in series with the monitored switch 12. The first transistor 30 is positioned between the monitored switch 12 and the negative side "A" of the bridge rectifier 23. Also positioned in the UD branch is an optocoupler 32 located between the first transistor 30 and the monitored switch 12 with its trigger pins ("1 and 2") in series with the first transistor and the monitored switch. A green LED 34 and a first resistor 35 are located in the UD Branch 24, in series, between the optocoupler 32 and second lead wire 27. A first diode 38 is located in the UD Branch between the first lead wire 26 and the negative side "B" of the bridge rectifier 23, with the diode oriented so as to prevent current flow backward through the UD Branch from side "B" of the rectifier 23 through monitored switch 12 to side "A". A second transistor 40 is positioned in the UD Branch 24 with its collector and emitter placed in a parallel circuit, parallel to the series combination of first transistor 30, optocoupler 32, green LED 34 and first resistor 35. The collector and emitter path of second transistor 40 is in series with the monitored switch 12. Accompanying second transistor 40 in parallel with the combination of first transistor 30, optocoupler 32, LED 34 and resistor 35 is a second resistor 42 and a parallel combination of third resistor 43 and a red-tinted LED 45. The base-emitter path of first transistor 30 forms a parallel combination with the collector-emitter path of the second transistor 40, which combination is in series with the resistor 42, resistor 43 and LED 45 combination. The base-emitter path 50 of second transistor 40 defines a path parallel to the monitored switch 12. A fourth resistor 52 and second diode 53 (oriented as shown) are positioned in the UD Branch 24 in series with the base-emitter path 50 of the second transistor 40 and in parallel with the monitored switch 12. A first capacitor 56 is placed across the UD branch 24 at rectifier 23 and a second capicator 57 is shown placed across the base and emitter terminals of first transistor 30.

Shown associated with the UD Branch 24 through the optocoupler 32 is a third power source 60 which provides DC power to a recording device 62 by way of pins 4 and 5 of optocoupler 32. The function of optocoupler 32 is explained in greater detail below. In the preferred embodiment, the recording device 62 is an oscilloscope and, as shown the third power source 60 is provided from the scope. Line 71 serves as the oscilloscope 62 signal input and Line 72 as the oscilloscpoe signal ground. Also within this third power circuit 64 are three resistors 66, 67, 68 and a capacitor 69.

Choosing circuit element specifications. When choosing the values of certain key elements of the switch position sensing device circuitry, and in developing different circuit arrangements which may have equivalent functions and which are within the scope of the present invention, the following rules and descriptions regarding the present invention should be born in mind. These rules and descriptions should not be considered exhaustive of the functions and relationships of the elements of the present invention; nor are the elements listed in A–F below to be considered the only "key" elements of the invention.

A. Second power supply provided by power source 20 and transformer 21 is chosen to provide sufficient voltage to cover the voltage drop across bridge rectifier 23, first transistor 30, optocoupler 32, and green LED 34, as well as resistor 35.

B. Resistor 35 is sized to limit current flow through first transistor 30 and LED 35 to an acceptable rate while still generating sufficient current through optocoupler 32 and green LED 34 to generate visible light in the respective LED's; assuming the power through these elements (30, 32, 34, 35) is provided strictly from the second power supply 20/21.

C. Resistors 42 and 43 are sized to provide a current limit for first transistor 30 when monitored switch 12 is closed and power is being provided from the second power source 20, 21; while at the same time resistor 42 limits current through LED 45 and second transistor 40 to an acceptable rate while still generating sufficient current through red LED 45 to generate visible light, when the monitored switch 12 is open and power is provided by primary power source 15. Resistors 42 and 43 further provide the majority of resistance to limit current throughout the UD Branch 24 to a sufficiently low amperage so as not to trigger operation of the primary load 11 while the switch 12 is open and the device 10 is "in the primary circuit". Resistor 43 serves to control the voltage drop across Red LED 45 as well as limit current across the RED LED.

D. Resistor 52 is a current limiting resistor sized relative to the requirements of second transistor 40 and assuming power is provided by the primary function power source 15.

E. First transistor 30 is sized so as to have capability of conducting enough current for the needs of optocoupler 32 and green LED 34; also to have sufficiently low base current requirement such that red LED 45 does not illuminate when the required base current is reached.

F. Second transistor 40 is sized with lower collector-emitter voltage than the parallel circuit containing optocoupler 32.

Figure 2A:
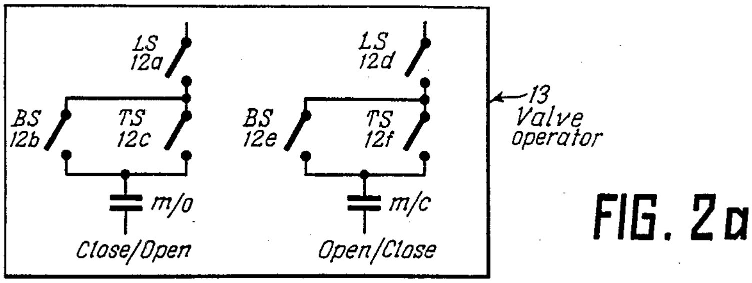
FIG. 2A is a schematic representation of the closed-/open circuit and the open/closed circuit within a valve operator, which circuits are acted upon by the switch position sensing circuit of FIG. 2.

FIG. 2 depicts a preferred embodiment of a new and useful application of the present invention utilizing multiple switch position sensing devices to monitor a plurality of switches 12a-12f. (Seen in FIG. 2A). These specific switches 12a-12f of the FIG. 2 embodiment are torque bypass and limit switches found in a valve operator 13. As typical to the art, the valve operator 13 comprises a close-open circuit and open-close circuit which are alternately activated through a switch "M". Each of the two circuits includes a limit switch 12a, 12d, and a parallel combination of a bypass switch 12b, 12e and torque switch 12c, 12f in series with the limit switch 12a, 12d. The operation of the torque, bypass and limit switches is completely within the control of the valve operator 13 and is not a subject of the present invention. It is the position of the switches 12a-12f, controlled by prior, known parameters, which is sensed and indicated by the present invention.

It is noted that each switch position sensing device 10a-10f is separately connected to one, and only one, of the valve operator limit, bypass or torque switches 12a-12f. Thus, each device 10a-10f, monitors the open and close position of one switch. The three devices 10a-10c which are monitoring the three switches 12a-12c of the close-open circuit of the valve operator 13 have their third power circuits 64a-64c connected together in parallel with one another and with the recording device 62, which is an oscilloscope in this embodiment. Likewise, the three devices 10d-10f which are monitoring the three switches 12d-12f of the open-close circuit of the valve operator 13 have their third power circuits 64d-64f tied together in parallel.

Second Power Source (20): 120 V AC.

Transistors (30,40): 2N3440 NPN SILICON POWER TRANSISTOR, $V_{CEO}$=250V, $P_T$=10W, $I_C$=1.0A, $h_{FE}$=40-160 @ $I_C$=0.02A.

Transformers (21): TRAID Part No. F10-250, 115VAC PRIMARY, 5.0V @ 0.25A SECONDARY, 2.5 VA.

Diodes (38,53): ECG Part No. 156, SILICON DIODE, Rated 1000V PRV @ 3A.

Bridge Rectifier (23): ECG Part No. 5332, SILICON BRIDGE, Rated 600V PRV @ 1A.

Capacitor (56): 1000 μF @ 16V.

Capacitor (57): 0.33 μF @ 50V.

Optocoupler (32): Part No. TIL 113, isolation voltage=750V @ 60MA ($I_C$=60ma$_{Max}$).

Third power supply (60): +15V regulated DC from Scope 62, Negative Ground.

Resistor (52): 56KΩ±2% 2W.

Resistor (43): 5.6KΩ±5% ½W.

Resistor (35): 100Ω±5% ½W.

Resistor (42): 15KΩ±10% 5W.

LED (45): RED, Size T-1¾, MCD Typ @ 20mA=25 MCD, Fwd Typ @ 20mA=2.0VTyp.

LED (34): GREEN, Size T-1¾, MCD Typ @ 20mA=50 MCD, Fwd. Typ @ 20mA=2.0 V Typ.

Resistor 67a: 15KΩ±5% ¼W.

Resistor 67b: 6.8KΩ±5% ¼W.

Resistor 67c: 3.3KΩ±5% ¼W.

Resistor 68: 6.8 mΩ±5% ¼W.

Resistor 66: 470Ω±5% ¼W.

Capacitor 69: 220 pf @ 30V.

Operation of the preferred embodiment. The switch position sensing device 10, or multiple devices 10a-f, are assembled as indicated in FIGS. 1 and/or 2. Since the primary function circuit 14 is that of a prior art apparatus 13, such as a valve operator, the switch position sensing device 10 of the present invention is constructed independently of the primary-function circuit 14 and independent of the monitored switch 12. The device 10 is constructed with lead wires 26, 27 for connection to the monitored switch 12. In its preferred use, the device 10 of the present invention is connected (for example, by alligator clips) to the monitored switch 12 for temporary monitoring and data recording and then disconnected from the monitored switch 12. The device is preferrably portable.

Once attached to the monitored switch 12, the switch position sensing device 10 functions as follows:

Second power source 20 is turned on to provide continuous DC power through rectifier 23 to the UD Branch 24. Likewise, third power source 60 is turned on to provide continuous DC power to the third power circuit 64, the flow of such power being controlled by the condition of optocoupler 32.

Switch closed. When the monitored switch 12 is closed, a short is created across lead wires 26, 27 such that the low voltage power provided by second source 20 is the dominant (only) current in the UD branch 24. Switch position sensing device 10a of FIG. 2 has been provided with arrows indicating the flow of current through the device as if the switch 12a were closed. The circuit elements of the UD branch 24 function as a current directing circuit to "direct" current to the respective visual indicator devices (green LED 34, third power circuit 64 at optocoupler 32, red LED 45). Note that current flows from point A clockwise around the UD branch 24 splitting at point C to provide current through resistors 42 and 43 to the base 48 of transistor 30, thus "turning on38 the transistor 30. At point C, current also flows through the collector of transistor 30 (since the transistor is turned-on) along the collector-emitter path to pin 1 of optocoupler 32. There is no base current to second transistor 40, so the second transistor is never "turned-on".

Optocoupler 32 is of a light sensitive type element having an LED connected between pins 1 and 2, and a phototransistor connected at pins 4, 5 and 6, all in a typical manner known in the art. As current flows through the LED loop or "trigger pins" (pins 1 and 2) of the optocoupler 32 the optocoupler LED illuminates, triggering conductivity of the phototransistor (at pins 4, 5 and 6) to allow current flow through the phototransistor within the third power circuit 64.

Current flowing through the LED loop (pin 1 and 2) of the optocoupler also passes through the green LED 34 to illuminate the green LED. Thus, when the green LED 34 illuminates, the tester has a visual, lighted indication that the monitored switch 12 is closed. From the green LED 34, current flows to the second lead wire 27, through the closed switch 12, to the first lead wire 26, through diode 38, back to point B of the rectifier 23, having by-passed completely transistor 40. In the preferred embodiment, there is not sufficient current flowing through red LED 45 with the switch 12 closed to illuminate the red LED even if voltage is sufficient to trigger current flow through the RED LED 45.

As a result of the function of optocoupler 32, current flowing through pins 1 and 2 of the optocoupler has resulted in pins 4 and 5 providing a closed circuit in third power circuit 64. A current and voltage is provided to the oscilloscope 62 in predetermined, set values created by the relationship between the power source 60 specifications and the resistor values 66, 67, 68. Thus, a known voltage curve will be created on the oscilloscope when the monitored switch 12 is closed.

Figure 3:
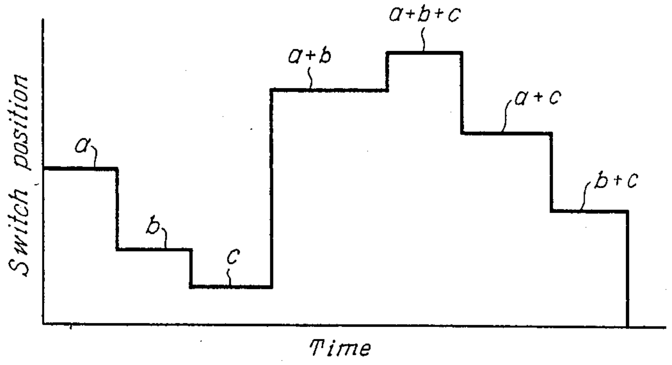
FIG. 3 is a sample, torque/limit switch position-time curve as may be generated during a valve opening cycle in accordance with the preferred embodiment of the present invention.
Figure 4:
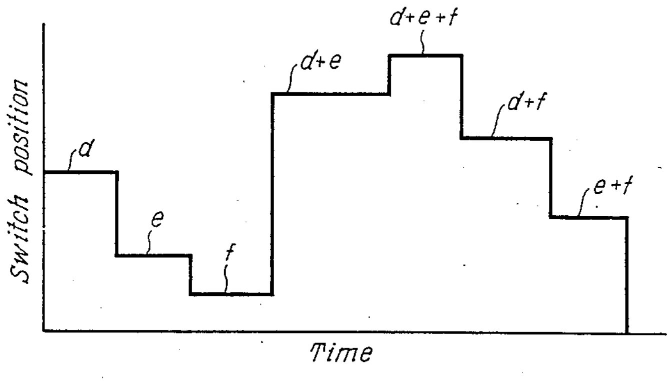
FIG. 4 is a sample torque/limit switch position-time curve as may be generated during a valve closing cycle in accordance with the preferred embodiment of the present invention.

With reference to the multiple sensing devices 10*a–f* of FIG. 2, it will be noted that a different resistor value has been provided for resistor 67 (67*a–c*; 67*d–f*) in each of the three connected and simultaneously monitored sensing devices 12*a, b, c* and 12*d, e, f*. Thus, a different known voltage will be indicated on the oscilloscope when each of switches 12*a*, 12*b*, and 12*c* is closed. Furthermore, when two or more of these switches are closed, a known, summation voltage will be indicated on the oscilloscope. Refer to FIGS. 3 and 4. In FIG. 3, "a" represents the generated voltage curve when only switch 12*a* is closed; "b" when only switch 12*b* is closed; "c" when only switch 12*c* is closed; +a+b+c" when switches 12*a*, 12*b*, and 12*c* are all closed; "a+c" when switches 12*a* and 12*c* are both closed; and "b+c" when switches 12*b* and 12*c* are both closed. FIG. 4 is similar to FIG. 3 but with letters d, e, f representing curves for closed switches 12*d*, 12*e*, and 12*f* respectively. In this way, the testing person can tell accurately that a switch or switches are closed and can tell which switch or switches are closed.

Open switch. When the monitored switch 12 is open, there is no longer a short across lead wires 26, 27 and, thus, the UD Branch 24 is no longer isolated (or bypassed) by the primary-function circuit 14. Thus, current from the primary-function circuit 14 will flow through the current directing UD branch 24. In the example of the preferred embodiment, the primary-function power source 15 provides, for example, 48 volt DC or 120 volt AC power through primary-function circuit 14. This high voltage power now controls the UD Branch 24. Reference is made to FIG. 1 and to switch position sensing device 10*b* of FIG. 2 which has been provided with arrows indicating current flow through the UD Branch 24 when the switch 12 is open.

It should be first noted that if switch 12 is open and no power is being provided by primary-function power source 15, there will be no current whatsoever flowing through the UD Branch 24 since current provided by the second source 20 encounters only deadend or open circuits and, thus, no current flows. (See also explanation below as to the embodiment of FIG. 5.)

However, when the monitored switch 12 is open and power is being provided by the primary-function power source 15, current enters the UD Branch 24 through first lead wire 26 and splits in two directions at point "D". Current flows to the base 50 of transistor 40 "turning on" the second transitor allowing current to flow through the collector-emitter path of the second transistor. At point D, current also flows clockwise along the UD Branch 24 through rectifier 23 to point "C". At point C, current takes the path of resistor 42 and red LED 45 taking the collector-emitter path of transistor 40, thus bypassing transistor 30. Therefore, current does not flow through the optocoupler 32 or green LED 34. The current does flow from the emitter of transistor 40 to and through second lead 27 back into the primary-function circuit 14. Thus, when the monitored switch 12 is open the red LED 45 is turned on while the green LED 34 remains unlit (never illuminated). Furthermore, since no current flows through pins 1 and 2 of optocoupler 32, the phototransister (pins 4,5,6) is never triggered and the third power circuit 64 remains an open circuit; and the voltage curve on oscilloscope 62 shows zero voltage.

With reference to the multiple switch position sensing devices 10*a–f* of FIG. 2, it is noted that certain switches may be open while others are closed. Therefore, the oscilloscope 62 may record a voltage resulting from the closing of one switch while indicating a zero voltage due to the opening of other switches. See FIGS. 3 and 4. Curves for a single closed switch, i.e. curve "a" for closed switch 12*a*, imply that the other monitored switches 12*b*, 12*c* are open. As stated above, since each third power circuit 64 (visual indicator circuit 64) generates a different voltage due to the difference in resistor values for resistor 67, the testing person can know which switch is closed and generating a voltage on the oscilloscope.

Although the preferred embodiment makes use of the red LED 45, the green LED 34 and the voltage recording circuit 64, other embodiments of the invention make use of only one of these visual indicators or any two of these indicators. For example, it is possible to use simply the green LED 34 if the user is to simply have a green signal indicate that the switch is closed and the absence of a green indicate that the switch is open. Likewise, a user of another embodiment uses the lighting of red LED 45 to indicate that the respective switch is open; and the absence of a red signal to indicate that the respective switch is closed. Likewise, the user of another embodiment makes use of only the voltage curves on the oscilloscope to indicate that a switch is closed or opened.

It should be noted that when the primary-function power source 15 is providing DC power to the primary-function circuit 14, it is necessary for the switch position sensing device of the preferred embodiment to be connected as shown in FIG. 1 with the first lead wire 26 connected to the positive (+) side of the monitored switch 12 and second lead wire 27 connected to the negative (−) side. If the primary-function power source 15 is providing alternating current through the primary-function circuit 14, there is no preference for connecting of the sensing device 10.

Figure 5:
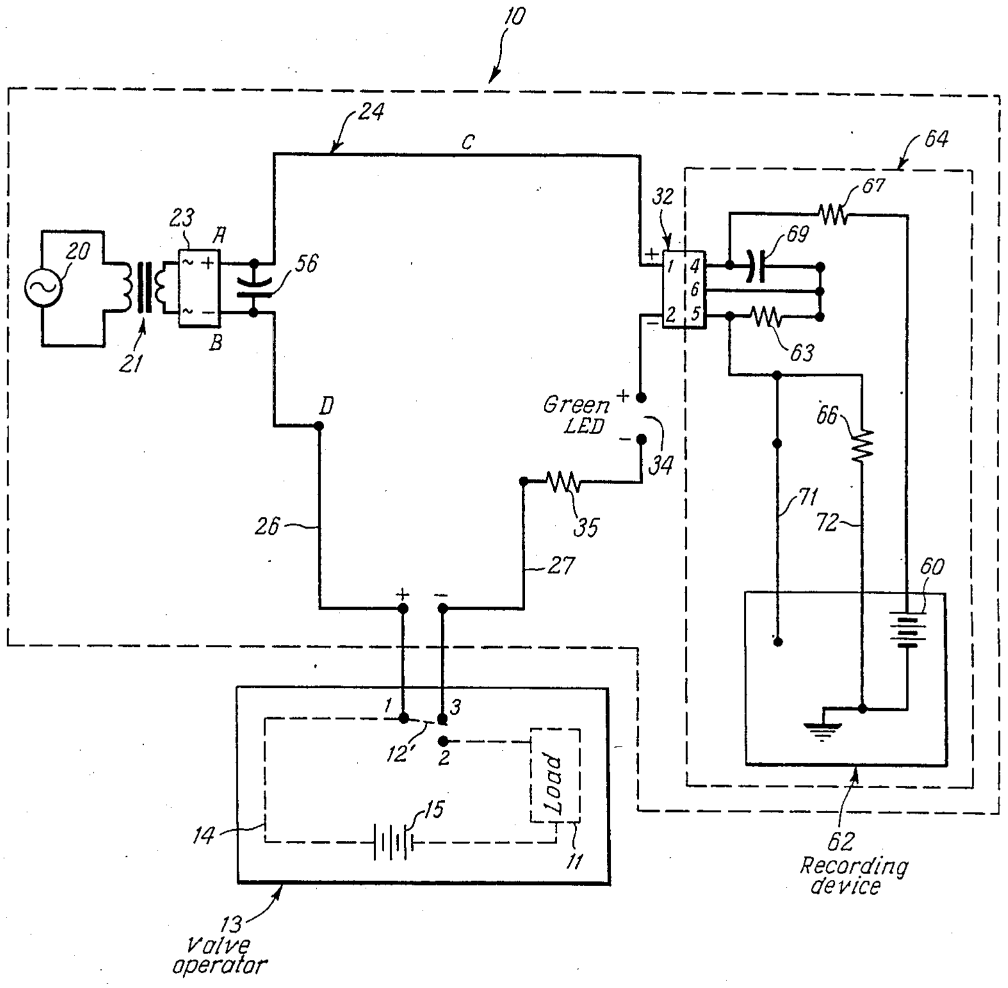
FIG. 5 is a schematic design of the present invention showing an alternate embodiment.

The embodiment of FIG. 5. It is well within the scope of the present invention to monitor the closing of a switch within a dead circuit or against a dead terminal. This is contemplated for though not limited to switch circuits, as seen in FIG. 5, where a single pole-double throw switch 12′ has three terminals, two of which (1 and 2) are in an active circuit 14 and two of which (1 and 3) are in a dead circuit (terminal 3 being a dead terminal). In such an arrangement, if the user chooses to monitor the switch against terminal 3, then the "monitored switch" 12′ (terminals 1-3) is not within the circuit supplied by a primary load 15. Thus in its "open" position, there is no chance of a power supply providing power to the UD Branch 24. Red LED 45 will never illuminate and there is no need for large resistance 42, 43 to prevent accidental operation of the load (there is no load in this "monitored" dead circuit). Though the embodiment of FIG. 1 functions fine for this use, a less populated embodiment as seen in FIG. 5 is possible when it is known that the sole function of the device will be to monitor this "dead switch". Therefore, in the embodiment of FIG. 5, large portions of the invention circuitry (and thus some of the inventive elements) are eliminated, but certain important inventive elements do remain.

In this "dead switch" monitoring embodiment of FIG. 5, two visual indicators remain—the indicator circuit (third power circuit) 64 and Green LED 34. Thus, the inventive element of an indicator circuit 64, having its own power supply, providing both visually perceptable and recordable data in the form of voltage curves of predetermined voltage in response to the existence of current provided by an independent power supply flowing through the monitored switch within a separate secondary circuit, remains. The use of a second or alternate visual indicator in the form of an LED 34 also remains.

Whereas this invention has been described in detail with particular reference to preferred embodiments thereof, it will be understood that variations and modifications can be effected within the spirit and scope of the invention, as described hereinbefore and as defined in the appended claims.

I claim:

1. In combination:

valve operator switch circuit including a close-to-open circuit and an open-to-close circuit, each circuit including a limit switch, a bypass switch and a torque switch, each switch being independently opened and closed, and wherein current is allowed to flow only in the alternative through the close-to-open circuit and the open-to-close circuit to open the valve and close the valve respectively;

first power source supplying power to said close-to-open circuit and to said open-to-close circuit;

at least a first switch position sensing circuit attached in parallel across one switch of said limit switch, bypass switch and torque switch of either said open-to-close circuit or said close-to-open circuit, said switch position sensing circuit comprising:

a second power supply for providing unidirectional current to a unidirectional branch between a positive pole and a negative pole;

first lead wire within said unidirectional branch connected to one side of said one switch of said valve operator switch circuit; and second lead wire within said unidirectional branch connected to the other side of said one switch, whereby said one switch lies within two circuits, being said valve operator switch circuit and said switch position sensing circuit;

current triggered switch component positioned within said unidirectional branch in series with said one switch, said current triggered switch component comprising a first current conducting element lying within said unidirectional branch for conducting said unidirectional current and second normally open switch element lying within a third current conducting circuit for conducting current from a third power supply, which normally open switch element is closed in response to the presence of current flowing through said first current conducting element;

first transistor means positioned within said unidirectional branch for selectively directing current to said first current conducting element of said current triggered switch component when said first transistor means is in its "on" state;

second transistor means positioned within said unidirectional branch for selectively directing current around said current triggered switch component to bypass said first current conducting element when said second transistor means is in its on-state and said first transistor means is in its off-state;

circuit conditioning means within said unidirectional branch for turning said first transistor means to its on-state when said one switch is in a closed condition, including means for preventing turn-on of said second transistor means, and for turning said second transistor means to its on-state when said one switch is in an open condition, including means for preventing turn-on of said first transistor means;

said third current conducting circuit including said normally open switch element of said current triggered switch component in series with a voltage recording device and a voltage limiting element, and said third power supply providing power to said third current conducting circuit when said normally open switch element is closed, whereby a predetermined voltage is recorded by the recording device of the third power circuit in response to the one switch of the valve operator circuitry being closed and no voltage is recorded through the third power circuit when the one switch is open.

* * * * *